(12) United States Patent
Lai et al.

(10) Patent No.: US 12,155,013 B2
(45) Date of Patent: Nov. 26, 2024

(54) LIGHT-EMITTING DEVICE INCLUDING PHOTOSENSOR FOR THE DETECTION OF MURA DEFECTS

(71) Applicant: Au Optronics Corporation, Hsinchu (TW)

(72) Inventors: Po-Chun Lai, Hsinchu (TW); Li-Wei Shih, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 660 days.

(21) Appl. No.: 17/385,930

(22) Filed: Jul. 27, 2021

(65) Prior Publication Data

US 2022/0359792 A1 Nov. 10, 2022

(30) Foreign Application Priority Data

May 6, 2021 (TW) .................................. 110116387

(51) Int. Cl.
*H01L 33/42* (2010.01)
*G09G 3/00* (2006.01)
(Continued)

(52) U.S. Cl.
CPC ............. *H01L 33/42* (2013.01); *G09G 3/006* (2013.01); *H01L 27/156* (2013.01); *H01L 33/38* (2013.01);
(Continued)

(58) Field of Classification Search
CPC .. H10K 59/13; H10K 59/60–65; G09G 3/006; G09G 2320/0233;
(Continued)

(56) References Cited

U.S. PATENT DOCUMENTS

2008/0061678 A1\* 3/2008 Hamano ................ H10K 59/13
313/498
2015/0001527 A1\* 1/2015 Tsang ...................... H01L 27/15
257/43

(Continued)

FOREIGN PATENT DOCUMENTS

| CN | 109148550 | 1/2019 |
| CN | 109904202 | 6/2019 |
| CN | 110828696 | 2/2020 |

*Primary Examiner* — Steven M Christopher
*Assistant Examiner* — Tyler J Wiegand
(74) *Attorney, Agent, or Firm* — JCIPRNET

(57) ABSTRACT

A light-emitting device including a first substrate, a first active element, a barrier layer, a first photosensitive element, a flat layer, and a first light-emitting diode is provided. The first active element is on the first substrate. The barrier layer is on the first active element. The first photosensitive element is on the barrier layer. The flat layer is on the first photosensitive element, and the first photosensitive element is between the barrier layer and the flat layer. The first light-emitting diode is on the flat layer. The first light-emitting diode includes a first electrode, a light-emitting layer, and a second electrode. The first electrode is electrically connected to the first active element. The first photosensitive element is not completely shielded by the first electrode in a normal direction of the first substrate. The light-emitting layer is on the first electrode. The second electrode is on the light-emitting layer.

20 Claims, 6 Drawing Sheets

(51) Int. Cl.
*H01L 27/15* (2006.01)
*H01L 33/38* (2010.01)
*H01L 33/46* (2010.01)

(52) U.S. Cl.
CPC ......... *H01L 33/46* (2013.01); *G09G 2330/12* (2013.01); *G09G 2360/148* (2013.01)

(58) Field of Classification Search
CPC .......... G09G 2320/029–0295; G09G 2330/12; G09G 2360/14–142; G09G 2360/145–148; H01L 33/44
See application file for complete search history.

(56) References Cited

U.S. PATENT DOCUMENTS

2017/0032167 A1* 2/2017 Chen .................... H01L 21/0274
2021/0407435 A1* 12/2021 Tang ...................... H10K 59/13

* cited by examiner

LIGHT-EMITTING DEVICE INCLUDING PHOTOSENSOR FOR THE DETECTION OF MURA DEFECTS

CROSS-REFERENCE TO RELATED APPLICATION

This application claims the priority benefit of Taiwan application serial no. 110116387, filed on May 6, 2021. The entirety of the above-mentioned patent application is hereby incorporated by reference herein and made a part of this specification.

BACKGROUND

Technical Field

The disclosure relates to a light-emitting device, and in particular to a light-emitting device having a first photosensitive element.

Description of Related Art

At present, after a display device is manufactured, in the factory, a camera (such as a charge-coupled device camera) captures an image displayed by the display device, and a computer analyzes whether the image displayed by the display device has a Mura defect or other errors. After it is confirmed that the display device has no Mura defects or other errors, the display device is shipped from the factory.

However, Mura defects occur in many display devices after a period of use. To detect these Mura defects that appear after a period of use, a display device needs to be shipped back to the factory, which greatly increases the time and cost required to inspect the display device.

SUMMARY

The disclosure provides a light-emitting device, whose display quality is monitored through its own photosensitive element.

At least one embodiment of the disclosure provides a light-emitting device. The light-emitting device includes a first substrate, a first active element, a barrier layer, a first photosensitive element, a flat layer, and a first light-emitting diode. The first active element is located on the first substrate. The barrier layer is located on the first active element. The first photosensitive element is located on the barrier layer. The flat layer is located on the first photosensitive element, and the first photosensitive element is located between the barrier layer and the flat layer. The first light-emitting diode is located on the flat layer. The first light-emitting diode includes a first electrode, a light-emitting layer, and a second electrode. The first electrode is electrically connected to the first active element. The first photosensitive element is not completely shielded by the first electrode in a normal direction of the first substrate. The light-emitting layer is located on the first electrode. The second electrode is located on the light-emitting layer.

DESCRIPTION OF THE EMBODIMENTS

Figure 1:
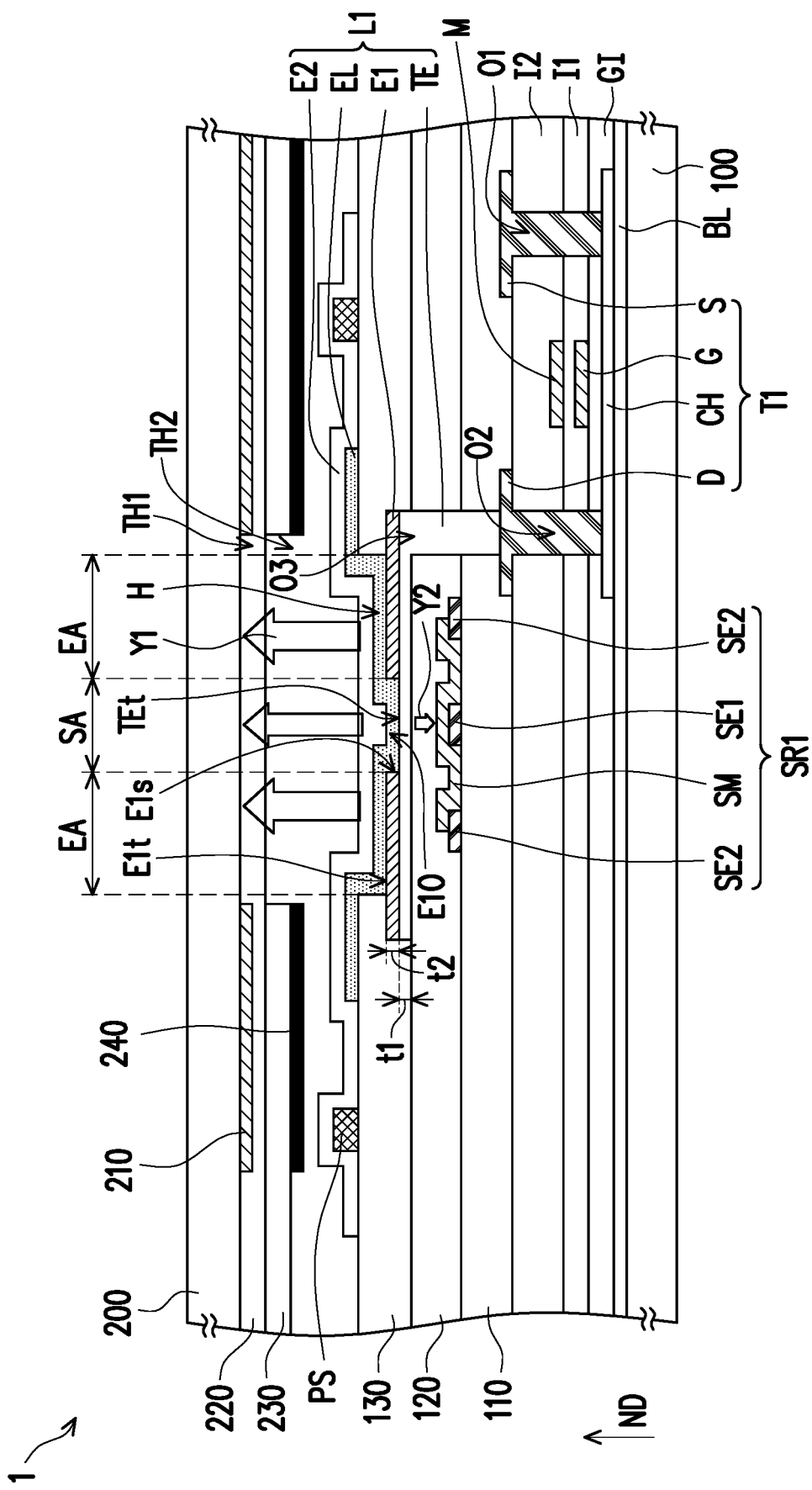
FIG. 1 is a schematic cross-sectional view of a light-emitting device according to an embodiment of the disclosure.

FIG. 1 is a schematic cross-sectional view of a light-emitting device according to an embodiment of the disclosure.

Referring to FIG. 1, a light-emitting device 1 includes a first substrate 100, a first active element T1, a barrier layer 110, a first photosensitive element SR1, a flat layer 120, and a first light-emitting diode L1. In this embodiment, the light-emitting device 1 further includes a buffer layer BL, a spacer PS, a second substrate 200, a reflection layer 210, a first passivation layer 220, a second passivation layer 230, and an antireflective layer 240.

A material of the first substrate 100 may be glass, quartz, an organic polymer, or an opaque/reflective material (such as a conductive material, a metal, a wafer, a ceramic or other applicable materials) or other applicable materials. If a conductive material or a metal is used, an insulating layer (not shown) covers the first substrate 100 to avoid a short circuit. In some embodiments, the first substrate 100 is a flexible substrate, and a material of the first substrate 100 is, for example, polyethylene terephthalate (PET), polyethylene naphthalate (PEN), polyester (PES), polymethylmethacrylate (PMMA), polycarbonate (PC), polyimide (PI) or a metal foil or other flexible materials.

The buffer layer BL is located on the first substrate 100. The buffer layer BL has a single-layer or multilayer structure. In some embodiments, the buffer layer BL is silicon oxide, silicon nitride, or a stacked layer of silicon oxide and silicon nitride, but the disclosure is not limited thereto.

The first active element T1 is located on the first substrate 100. The first active element T1 includes a channel layer CH, a gate G, a source S, and a drain D. The gate G overlaps the channel layer CH, and a gate insulating layer GI is sandwiched between the gate G and the channel layer CH. A first insulating layer I1 covers the gate G. A second insulating layer I2 covers the first insulating layer I1. The source S and the drain D are located on the second insulating layer I2, and are electrically connected to the channel layer CH through an opening O1 and O2, respectively. The openings O1 and O2 penetrate the gate insulating layer GI, the first insulating layer I1, and the second insulating layer I2. In this embodiment, a signal line M is located between the second insulating layer I2 and the first insulating layer I1, and overlaps the gate G.

Although in this embodiment, the first active element T1 is a top-gate thin-film transistor as an example, the disclosure is not limited thereto. In other embodiments, the first active element T1 may be a bottom-gate thin-film transistor or other types of thin-film transistors.

The barrier layer 110 is located on the first active element T1. The first photosensitive element SR1 is located on the barrier layer 110. In this embodiment, the first photosensitive element SR1 includes a first sensing electrode SE1, a second sensing electrode SE2, and a photosensitive material SM.

The first sensing electrode SE1 and the second sensing electrode SE2 are located on the barrier layer 110. The first sensing electrode SE1 and the second sensing electrode SE2 are separated from each other. In some embodiments, the first sensing electrode SE1 and the second sensing electrode SE2 belong to a same conductive layer and are formed by a same patterning process, but the disclosure is not limited thereto. In this embodiment, the first photosensitive element SR1 includes two second sensing electrodes SE2 and one first sensing electrode SE1, and the first sensing electrode SE1 is located between the two second sensing electrodes SE2. In some embodiments, a spacing between the first sensing electrode SE1 and the second sensing electrode SE2 is 1 micrometer to 200 micrometers.

The photosensitive material SM is located between the first sensing electrode SE1 and the second sensing electrode SE2. In some embodiments, a material of the photosensitive material SM includes, for example, silicon-rich oxide, silicon-rich oxynitride, silicon-rich carbide, silicon-rich carbon oxide, hydrogenated silicon-rich oxide, hydrogenated silicon-rich nitride, hydrogenated silicon-rich carbide or a combination thereof, but the disclosure is not limited thereto. In other embodiments, the photosensitive material SM includes a stacked layer of P-type semiconductor, intrinsic semiconductor, and N-type semiconductor.

The flat layer 120 is located on the first photosensitive element SR1, and the first photosensitive element SR1 is located between the barrier layer 110 and the flat layer 120. In this embodiment, the photosensitive material SM is located between the first sensing electrode SE1 and the flat layer 120 and between the second sensing electrode SE2 and the flat layer 120.

The first light-emitting diode L1 is located on the flat layer 120. The first light-emitting diode L1 includes a first electrode E1, a light-emitting layer EL, and a second electrode E2. In this embodiment, the first light-emitting diode L1 further includes a transparent electrode TE.

The transparent electrode TE is located on the flat layer 120. A thickness t1 of the transparent electrode TE is 1 nanometer to 500 nanometers. A material of the transparent electrode TE includes a conductive oxide, such as indium tin oxide, indium zinc oxide, aluminum tin oxide, aluminum zinc oxide, indium-gallium-zinc-oxide or other conductive materials. The transparent electrode TE is electrically connected to the drain D of the first active element T1 through an opening O3. The opening O3 penetrates the barrier layer 110 and the flat layer 120, for example. The transparent electrode TE at least partially overlaps the first photosensitive element SR1 in a normal direction ND of the first substrate 100.

The first electrode E1 is formed on the transparent electrode TE. The first electrode E1 is electrically connected to the first active element T1 through the transparent electrode TE. A thickness t2 of the first electrode E1 is 1 nanometer to 500 nanometers. In this embodiment, the first electrode E1 includes an opaque material, such as metal or other conductive materials. The first electrode E1 has, for example, a higher light reflectivity than the transparent electrode TE does, thereby improving the luminous efficiency of the display device 1.

The first photosensitive element SR is not completely shielded by the first electrode E1 in the normal direction ND of the first substrate 100. For example, the first electrode E1 has an opening E1O that overlaps the transparent electrode TE, and the opening E1O overlaps the first photosensitive element SR1 in the normal direction ND of the first substrate 100, so that the first photosensitive element SR1 is not completely shielded by the first electrode E1. The aforementioned "the first photosensitive element SR is not completely shielded by the first electrode E1 in the normal direction ND of the first substrate 100" may be "the entire first photosensitive element SR1 is not shielded by the first electrode E1 in the normal direction ND of the first substrate 100" or "a part of the first photosensitive element SR1 is not shielded by the first electrode E1 in the normal direction ND of the first substrate 100".

A pixel defining layer 130 is located on the flat layer 120 and has an opening H overlapping the first electrode E1. The light-emitting layer EL fills the opening H of the pixel defining layer 130, and the light-emitting layer EL is located on the first electrode E1. In this embodiment, the light-emitting layer EL extends from an upper surface E1t of the first electrode E1 along the side wall E1 of the opening E1O of the first electrode E1 to an upper surface TEt of the transparent electrode TE. In other words, the light-emitting layer EL fills the opening E1O of the first electrode E1.

The second electrode E2 is located on the light-emitting layer EL. In some embodiments, a spacer PS is formed on the pixel defining layer 130, and the second electrode E2 is formed on the light-emitting layer EL, the spacer PS, and the pixel defining layer 130.

In some embodiments, the first light-emitting diode L1 is an organic light-emitting diode, and the light-emitting layer EL includes an organic material. In some embodiments, the light-emitting layer EL includes a combination of an electron injection layer, an electron transport layer, a hole transport layer, and a hole injection layer, but the disclosure is not limited thereto.

A part of the light-emitting layer EL that contacts the upper surface TEt of the transparent electrode TE is defined as a sensing region SA, and a part of the light-emitting layer EL that contacts the upper surface E1t of the first electrode E1 is defined as a light-emitting region EA. The sensing region SA overlaps the first photosensitive element SR1 in the normal direction ND of the first substrate 100. In some embodiments, the light-emitting region EA surrounds the sensing region SA, but the disclosure is not limited thereto. In some embodiments, a ratio of an area of the light-emitting region EA to an area of the sensing region SA is 1 to 2000.

In this embodiment, both the sensing region SA and the light-emitting region EA emit light. In this embodiment, the first light-emitting diode L1 emits light Y1 upward (toward the second substrate 200), and emits light Y2 downward (toward the first substrate 100). In some embodiments, the first electrode E1 includes a reflective material, thereby increasing the light Y1 emitted upward from the light-emitting region EA. The transparent electrode TE includes a transparent material, so the sensing region SA emits the light Y2 downward in addition to the light Y1 upward.

The first photosensitive element SR1 receives the light Y2 to detect whether there is color shift or other problems in the first light-emitting diode L1. In other words, the first photosensitive element SR1 is adapted for detecting defects of the first light-emitting diode L1. Therefore, the display quality of the display device 1 may be inspected without the need to ship the display device 1 back to a factory.

In the normal direction ND of the first substrate 100, the second substrate 200 overlaps the first substrate 100, and the first light-emitting diode L1 and the first photosensitive element SR1 are located between the first substrate 100 and the second substrate 200.

A material of the second substrate 200 may be glass, quartz, an organic polymer or other applicable materials. In some embodiments, the second substrate 200 is a flexible substrate, and a material of the second substrate 200 is, for example, polyethylene terephthalate (PET), polyethylene naphthalate (PEN), polyester (PES), polymethylmethacrylate (PMMA), polycarbonate (PC), polyimide (PI) or other flexible materials.

The reflection layer 210 is located on the second substrate 200. In some embodiments, a material of the reflection layer 210 includes metal or other conductive materials, and the reflection layer 210 is adapted for touch electrodes. The reflection layer 210 does not overlap the light-emitting region EA and the sensing region SA in the normal direction ND of the first substrate 100. In this embodiment, the reflection layer 210 has a first via TH1, and the first via TH1 overlaps the light-emitting region EA and the sensing region SA in the normal direction ND of the first substrate 100, so that the light Y1 emitted upward by the first light-emitting diode L1 can pass through the first via TH1.

The first passivation layer 220 and the second passivation layer 230 are located on the reflection layer 210. The antireflective layer 240 is located on the first passivation layer 220 and the second passivation layer 230. In some embodiments, a material of the antireflective layer 240 includes black resin, chromium, chromium oxide, molybdenum oxide or other materials with low light reflectivity. The antireflective layer 240 may prevent the light Y1 emitted upward by the first light-emitting diode L1 from being reflected to a position of other light-emitting diodes, thereby preventing the light emitted by different light-emitting diodes from interfering with each other.

The antireflective layer 240 does not overlap the light-emitting region EA and the sensing region SA in the normal direction ND of the first substrate 100. In this embodiment, the antireflective layer 240 has a second via TH2, and the second via TH2 overlaps the light-emitting region EA and the sensing region SA in the normal ND direction of the first substrate 100, so that the light Y1 emitted upward by the first light-emitting diode L1 can pass through the second via TH2. In some embodiments, the second via TH2 extends into the second passivation layer 230, thereby improving the transmittance.

Based on the above, the first photosensitive element SR1 may inspect the light L2 emitted by the first light-emitting diode L1 and detect whether the first light-emitting diode L1 generates a defect. Therefore, the time required for inspecting the light-emitting device 1 may be reduced.

Figure 2:
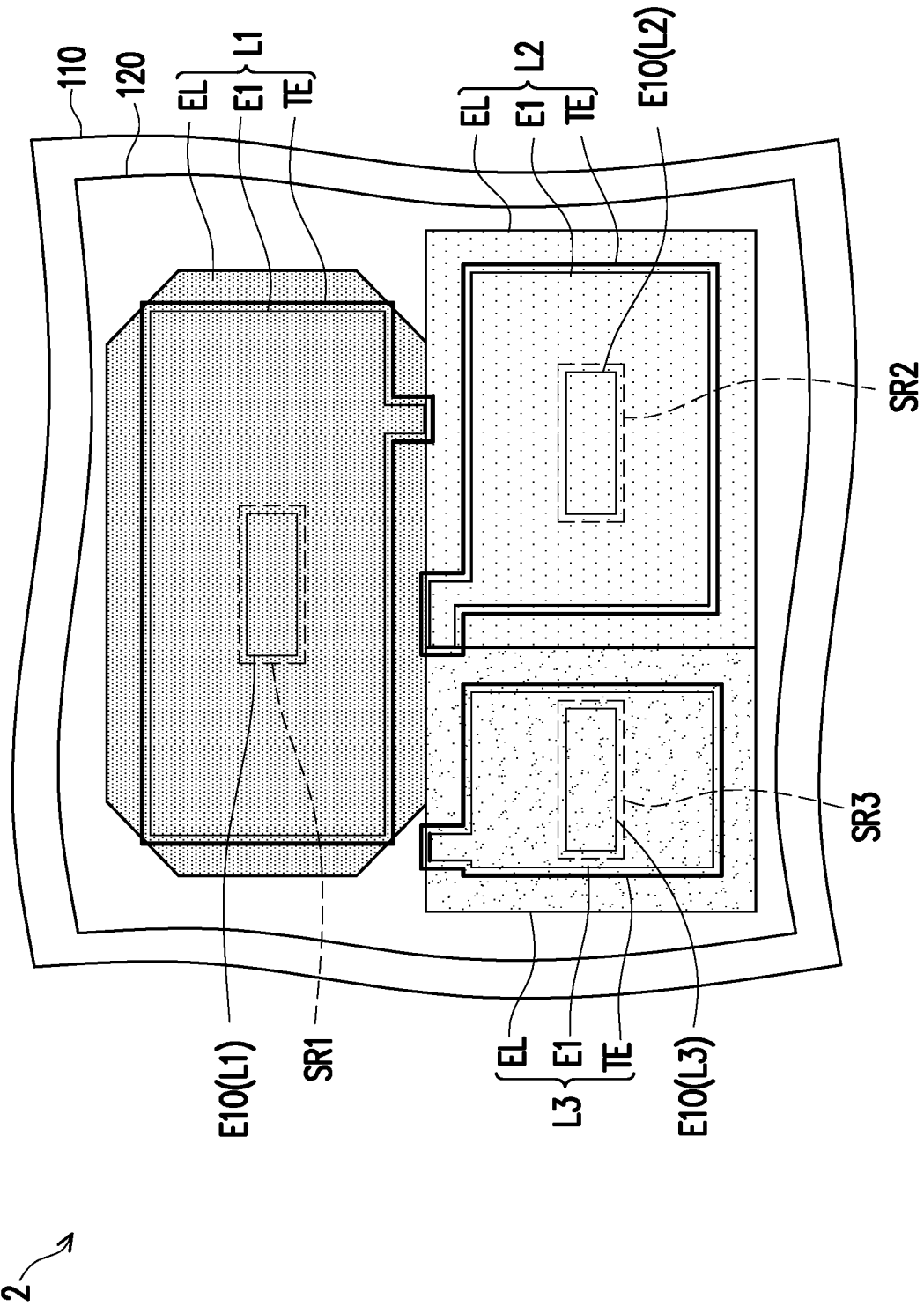
FIG. 2 is a schematic top view of a light-emitting device according to an embodiment of the disclosure.

FIG. 2 is a schematic top view of a light-emitting device according to an embodiment of the disclosure. It is to be noted that the element symbols and a part of the content of the embodiment of FIG. 1 are used in the embodiment of FIG. 2, and same or similar symbols are used to represent same or similar elements, and the description of the same technical content is omitted. The aforementioned embodiment can be referred to for the description of the omitting parts, and details thereof will not be repeated herein.

In this embodiment, a light-emitting device 2 includes the first light-emitting diode L1, a second light-emitting diode L2, and a third light-emitting diode L3. For the convenience of description, FIG. 2 illustrates the transparent electrode TE, the first electrode E1, and the light-emitting layer EL of each of the first light-emitting diode L1, the second light-emitting diode L2, and the third light-emitting diode L3, and the other components in the first light-emitting diode L1, the second light-emitting diode L2, and the third light-emitting diode L3 are omitted. The first light-emitting diode L1, the second light-emitting diode L2, and the third light-emitting diode L3 are respectively electrically connected to a corresponding active element (not shown). The first light-emitting diode L1 and the first active element T1 in FIG. 1 can be referred to for the method of the first light-emitting diode L1, the second light-emitting diode L2, and the third light-emitting diode L3 being electrically connected to the active element, and details thereof will not be repeated herein.

Referring to FIG. 2, the first photosensitive element SR1, a second photosensitive element SR2, and a third photosensitive element SR3 are located on the barrier layer 110. The flat layer 120 is located on the first photosensitive element SR1, the second photosensitive element SR2, and the third photosensitive element SR3. The first light-emitting diode L1, the second light-emitting diode L2, and the third light-emitting diode L3 are located on the flat layer 120.

The first light-emitting diode L1, the second light-emitting diode L2, and the third light-emitting diode L3 respectively overlap the first photosensitive element SR1, the second photosensitive element SR2, and the third photosensitive element SR3 in the normal direction (the direction perpendicular to the paper surface of FIG. 2) of the first substrate. In this embodiment, the first electrode E1 of each of the first light-emitting diode L1, the second light-emitting diode L2, and the third light-emitting diode L3 has the opening E1O, and the opening E1O of each of the first light-emitting diode L1, the second light-emitting diode L2, and the third light-emitting diode L3 respectively overlaps the first photosensitive element SR1, the second photosensitive element SR2, and the third photosensitive element SR3 in the normal direction of the first substrate.

The first photosensitive element SR1, the second photosensitive element SR2, and the third photosensitive element SR3 are electrically connected to a sensing circuit (not shown).

In this embodiment, the light-emitting layer EL of the first light-emitting diode L1, the light-emitting layer EL of the second light-emitting diode L2, and the light-emitting layer EL of the third light-emitting diode L3 are organic light-emitting materials in different colors. In other words, the first light-emitting diode L1, the second light-emitting diode L2, and the third light-emitting diode L3 are organic light-emitting diodes of different colors, but the disclosure is not limited thereto. In other embodiments, the first light-emitting diode L1, the second light-emitting diode L2, and the third light-emitting diode L3 are organic light-emitting diodes of a same color.

In this embodiment, the first light-emitting diode L1, the second light-emitting diode L2, and the third light-emitting diode L3 are located in a same pixel. For example, the first light-emitting diode L1, the second light-emitting diode L2, and the third light-emitting diode L3 are, respectively, a blue light-emitting diode, a green light-emitting diode, and a red light-emitting diode of a same pixel. Based on the above, the first photosensitive element SR1, the second photosensitive element SR2, and the third photosensitive element SR3 may be used to detect whether there is color shift or other problems in the light-emitting diodes of different colors.

Based on the above, the first photosensitive element SR1, the second photosensitive element SR2, and the third photosensitive element SR3 are adapted for detecting the defects of the first light-emitting diode L1, the second light-emitting diode L2, and the third light-emitting diode L3; therefore, the display quality of the display device 2 may be inspected without the need to ship the display device 2 back to the factory.

Figure 3A:
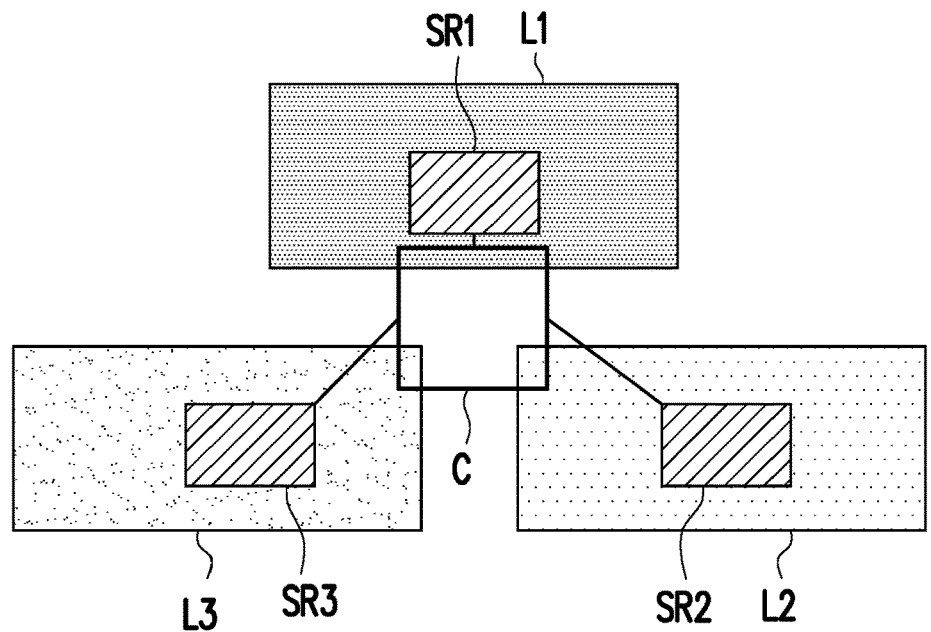
FIG. 3A is a schematic top view of a light-emitting device according to an embodiment of the disclosure.
Figure 3B:
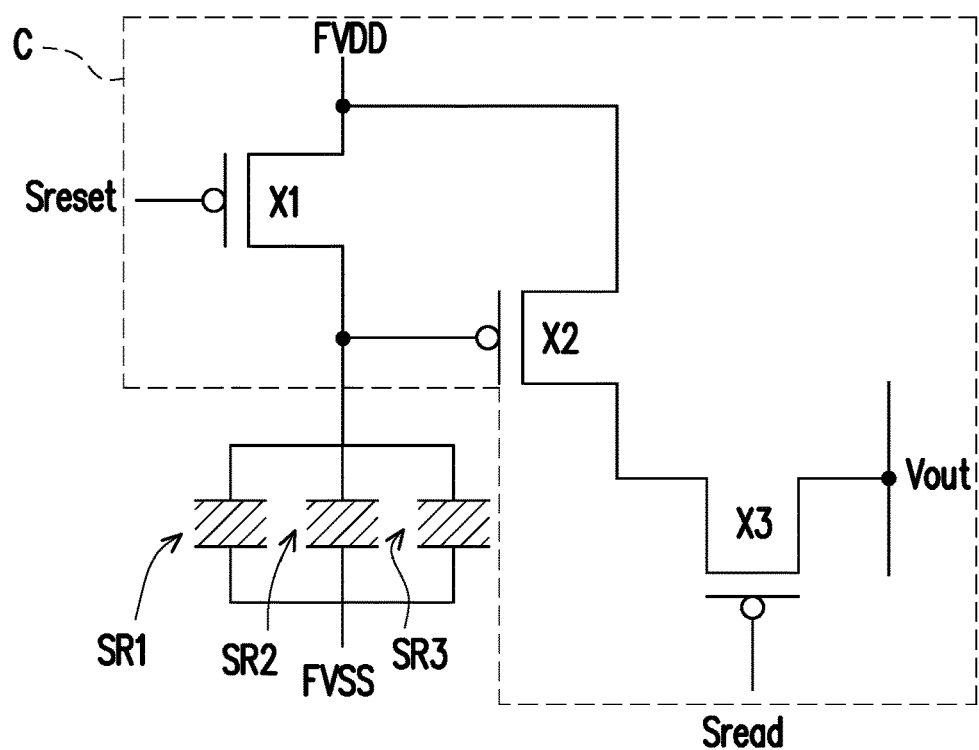
FIG. 3B is a schematic view of a detection circuit of a photosensitive element according to an embodiment of the disclosure.

FIG. 3A is a schematic top view of a light-emitting device according to an embodiment of the disclosure. FIG. 3B is a schematic view of a detection circuit of a photosensitive element according to an embodiment of the disclosure.

It is be noted that the embodiment of FIGS. 3A and 3B use the element symbols and a part of the content of the embodiment of FIG. 2, and the same or similar symbols are used to represent the same or similar elements, and the description of the same technical content is omitted. The aforementioned embodiment can be referred to for the description of the omitting parts, and details thereof will not be repeated herein.

Referring to FIGS. 3A and 3B, in this embodiment, the first light-emitting diode L1, the second light-emitting diode L2, and the third light-emitting diode L3 respectively overlap the first photosensitive element SR1, the second photosensitive element SR2, and the photosensitive element SR3 in the normal direction (the direction perpendicular to the paper surface of FIG. 3A) of the first substrate. The first photosensitive element SR1, the second photosensitive element SR2, and the third photosensitive element SR3 are electrically connected in parallel. For example, the first sensing electrode of the first photosensitive element SR1, the second photosensitive element SR2, and the third photosensitive element SR3 is electrically connected to a detection circuit C, and the second sensing electrode of the first photosensitive element SR1, the second photosensitive element SR2, and the third photosensitive element SR3 is electrically connected to a voltage FVSS. In other embodiments, the second sensing electrode of the first photosensitive element SR1, the second photosensitive element SR2, and the third photosensitive element SR3 is electrically connected to the detection circuit C, and the first sensing electrode of the first photosensitive element SR1, the second photosensitive element SR2 and the third photosensitive element SR3 is electrically connected to the voltage FVSS.

In this embodiment, the detection circuit C includes three switching elements X1, X2, and X3.

The source of the switching element X1 is electrically connected to an operating voltage FVDD. A reset signal Sreset is applied to the gate of the switching element X1 to control the ON or OFF of the switching element X1. The drain of the switching element X1 is electrically connected to the first photosensitive element SR1, the second photosensitive element SR2, and the third photosensitive element SR3 connected in parallel.

The source of the switching element X2 is electrically connected to the operating voltage FVDD. The gate of the switching element X2 is electrically connected to the drain of the switching element X1.

The source of the switching element X3 is electrically connected to the drain of the switching element X2. A read signal Sread is applied to the gate of the switching element X3 to control the ON or OFF of the switching element X3. A signal Vout output from the drain of the switching element X3 is read to derive a detection result of the first photosensitive element SR1, the second photosensitive element SR2, and the third photosensitive element SR3.

In this embodiment, the first photosensitive element SR1, the second photosensitive element SR2, and the third photosensitive element SR3 are electrically connected to the same detection circuit C, thereby reducing space for circuit layout. In some embodiments, when the light-emitting device is being inspected, the first light-emitting diode L1, the second light-emitting diode L2, and the third light-emitting diode L3 of different colors take turns to be powered on so that defects of the first light-emitting diode L1, the second light-emitting diode L2, and the third light-emitting diode L3 of different colors are respectively detected, but the disclosure is not limited thereto. In other embodiment, when the light-emitting device is being inspected, the first light-emitting diode L1, the second light-emitting diode L2, and the third light-emitting diode L3 are powered on at the same time so that defects of the first light-emitting diode L1, the second light-emitting diode L2, and the third light-emitting diode L3 are detected at the same time.

Figure 4:
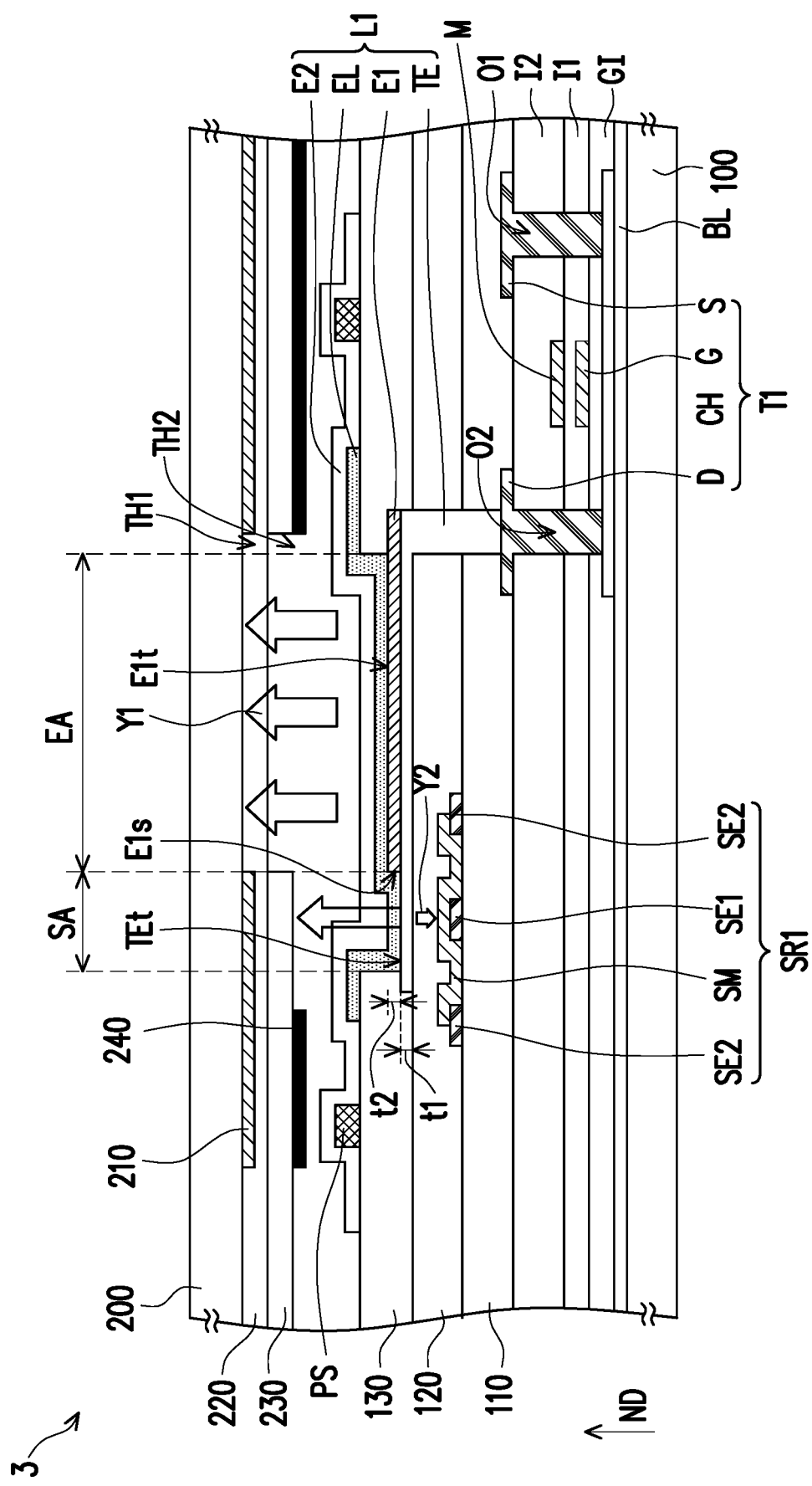
FIG. 4 is a schematic cross-sectional view of a light-emitting device according to an embodiment of the disclosure.

FIG. 4 is a schematic cross-sectional view of a light-emitting device according to an embodiment of the disclosure.

It is be noted that the embodiment of FIG. 4 uses the element symbols and a part of the content of the embodiment of FIG. 1, and the same or similar symbols are used to represent the same or similar elements, and the description of the same technical content is omitted. The aforementioned embodiment can be referred to for the description of the omitting parts, and details thereof will not be repeated herein.

The main difference between a light-emitting device 3 in FIG. 4 and the light-emitting device 1 in FIG. 1 is: in the first light-emitting diode L1 in FIG. 4, the sensing region SA is located on a side of the light-emitting region EA.

Referring to FIG. 4, the light-emitting layer EL extends from the upper surface E1*t* of the first electrode E1 along the side wall E1 of the first electrode E1 to the upper surface TEt of the transparent electrode TE. A part of the light-emitting layer EL that contacts the upper surface TEt of the transparent electrode TE is defined as the sensing region SA, and a part of the light-emitting layer EL that contacts the upper surface E1*t* of the first electrode E1 is defined as the light-emitting region EA. The sensing region SA overlaps the first photosensitive element SR1 in the normal direction ND of the first substrate 110.

In this embodiment, the sensing region SA is located on a side of the light-emitting region EA. In other words, in this embodiment, the light-emitting region EA does not surround the sensing region SA.

In this embodiment, the reflection layer 210 overlaps the sensing region SA in the normal direction ND of the first substrate 100. The antireflective layer 240 does not overlap the light-emitting region EA and the sensing region SA in the normal direction ND of the first substrate 100. In this embodiment, the reflection layer 210 has the first via TH1. The first via TH1 overlaps the light-emitting region EA in the normal direction ND of the first substrate 100. The antireflective layer 240 has the second via TH2, and the second via TH2 overlaps the light-emitting region EA and the sensing region SA in the normal direction ND of the first substrate 100.

In this embodiment, both the sensing region SA and the light-emitting region EA emit light. In this embodiment, the first light-emitting diode L1 emits the light Y1 upward (toward the second substrate 200), and emits the light Y2 downward (toward the first substrate 100). In some embodiments, the first electrode E1 includes a reflective material, thereby increasing the light Y1 emitted upward from the light-emitting region EA. The transparent electrode TE includes a transparent material, so the sensing region SA emits the light Y2 downward in addition to the light Y1 upward.

In this embodiment, the light Y1 emitted upward from the sensing region SA is reflected by the reflection layer 210. The reflected light Y1 may pass through the first light-emitting diode L1 and be received by the first photosensitive element SR1, thereby increasing light signals received by the first photosensitive element SR1. In addition, the reflection layer 210 may further prevent light outside the display device 3 from being irradiated to the first photosensitive element SR1 to reduce the interference of external light on the first photosensitive element SR1. In addition, the reflection layer 210 overlapping the sensing region SA may prevent the emitted light Y1 from leaving the display device 3 from the second substrate 200, thereby preventing the display quality from being affected due to the brightness of the light Y1 emitted from the sensing region SA and the light-emitting region EA being inconsistent.

The first photosensitive element SR1 receives the light Y2 and the reflected light Y1, thereby detecting whether there is color shift or other problems in the first light-emitting diode L1. In other words, the first photosensitive element SR1 is adapted for detecting defects of the first light-emitting diode L1; therefore, the display quality of the display device 3 may be inspected without the need to ship the display device 3 back to the factory.

Figure 5:
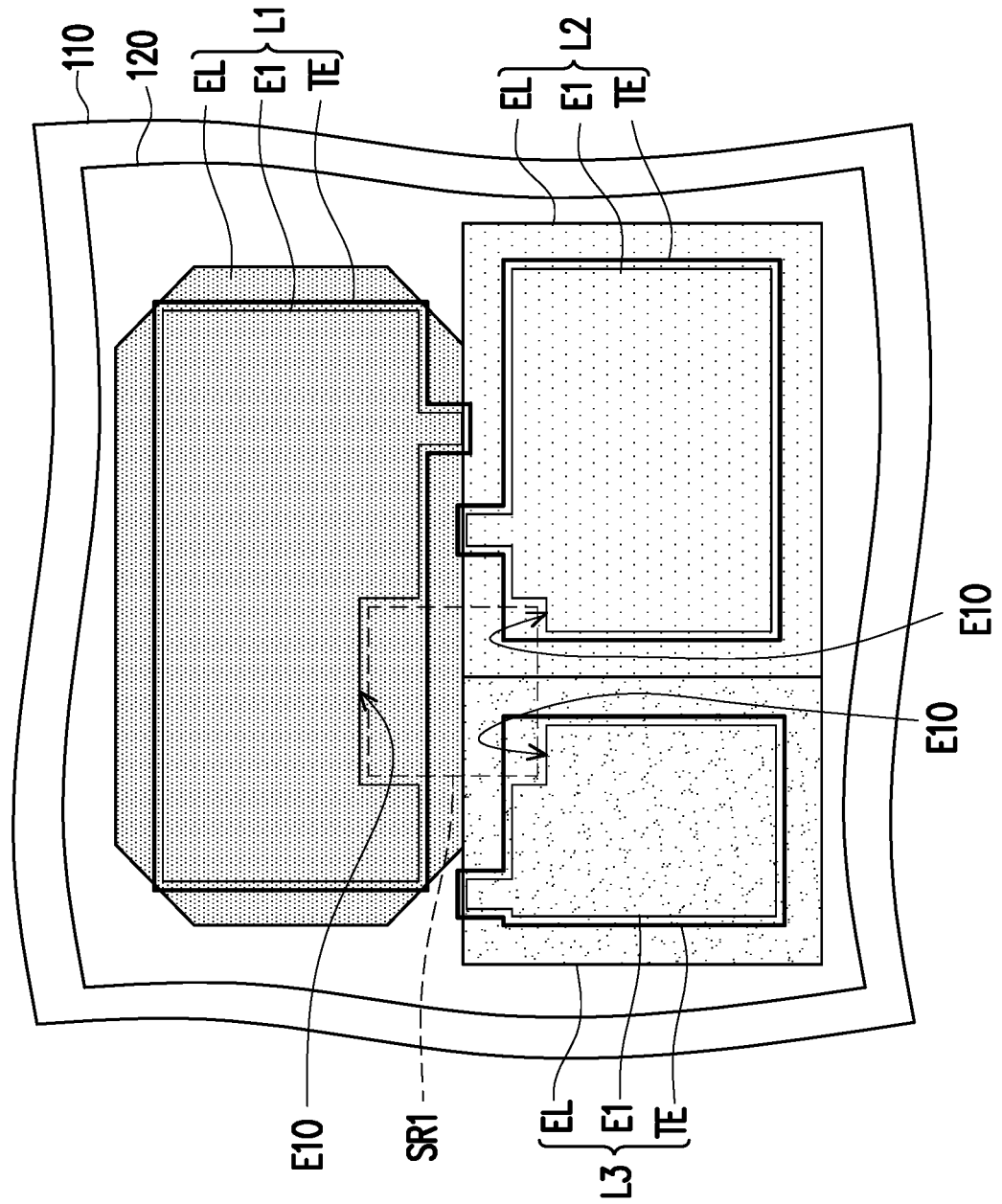
FIG. 5 is a schematic top view of a light-emitting device according to an embodiment of the disclosure.

FIG. 5 is a schematic top view of a light-emitting device according to an embodiment of the disclosure.

It is be noted that the embodiment of FIG. 5 uses the element symbols and a part of the content of the embodiment of FIG. 4, and the same or similar symbols are used to represent the same or similar elements, and the description of the same technical content is omitted. The aforementioned embodiment can be referred to for the description of the omitting parts, and details thereof will not be repeated herein.

In this embodiment, a light-emitting device 4 includes the first light-emitting diode L1, the second light-emitting diode L2, and the third light-emitting diode L3. For the convenience of description, FIG. 5 illustrates the transparent electrode TE, the first electrode E1, and the light-emitting layer EL of each of the first light-emitting diode L1, the second light-emitting diode L2, and the third light-emitting diode L3, and the other components in the first light-emitting diode L1, the second light-emitting diode L2, and the third light-emitting diode L3 are omitted. The first light-emitting diode L1, the second light-emitting diode L2, and the third light-emitting diode L3 are respectively electrically connected to a corresponding active element (not shown). The first light-emitting diode L1 and the first active element T1 in FIG. 4 can be referred to for the method of the first light-emitting diode L1, the second light-emitting diode L2, and the third light-emitting diode L3 being electrically connected to the active element, and details thereof will not be repeated herein.

Referring to FIG. 5, the first photosensitive element SR1 is located on the barrier layer 110. The flat layer 120 is located on the first photosensitive element SR1. The first light-emitting diode L1, the second light-emitting diode L2, and the third light-emitting diode L3 are located on the flat layer 120.

The first light-emitting diode L1, the second light-emitting diode L2, and the third light-emitting diode L3 all partially overlap the first photosensitive element SR1 in the normal direction (the direction perpendicular to the paper surface of FIG. 5) of the first substrate. In this embodiment, the first electrode E1 of each of the first light-emitting diode L1, the second light-emitting diode L2, and the third light-emitting diode L3 has the opening E1O at a position close to the first photosensitive element SR1.

The first photosensitive element SR1 is electrically connected to a sensing circuit (not shown).

In this embodiment, the light-emitting layer EL of the first light-emitting diode L1, the light-emitting layer EL of the second light-emitting diode L2, and the light-emitting layer EL of the third light-emitting diode L3 are organic light-emitting materials in different colors. In other words, the first light-emitting diode L1, the second light-emitting diode L2, and the third light-emitting diode L3 are organic light-emitting diodes of different colors, but the disclosure is not limited thereto. In other embodiments, the first light-emitting diode L1, the second light-emitting diode L2, and the third light-emitting diode L3 are organic light-emitting diodes of a same color.

In this embodiment, the first light-emitting diode L1, the second light-emitting diode L2, and the third light-emitting diode L3 are located in a same pixel. For example, the first light-emitting diode L1, the second light-emitting diode L2, and the third light-emitting diode L3 are, respectively, a blue light-emitting diode, a green light-emitting diode, and a red light-emitting diode of a same pixel. Based on the above, the first photosensitive element SR1 may be used to detect whether there is color shift or other problems in the light-emitting diodes of different colors.

Based on the above, the first photosensitive element SR1 is adapted for detecting the defects of the first light-emitting diode L1, the second light-emitting diode L2, and the third light-emitting diode L3; therefore, the display quality of the display device 4 may be inspected without the need to ship the display device 4 back to the factory.

Figure 6A:
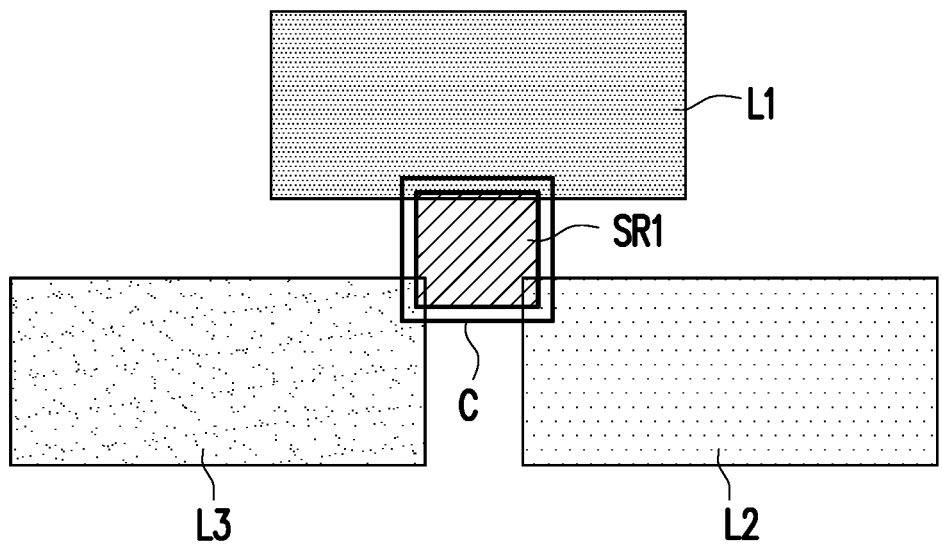
FIG. 6A is a schematic top view of a light-emitting device according to an embodiment of the disclosure.
Figure 6B:
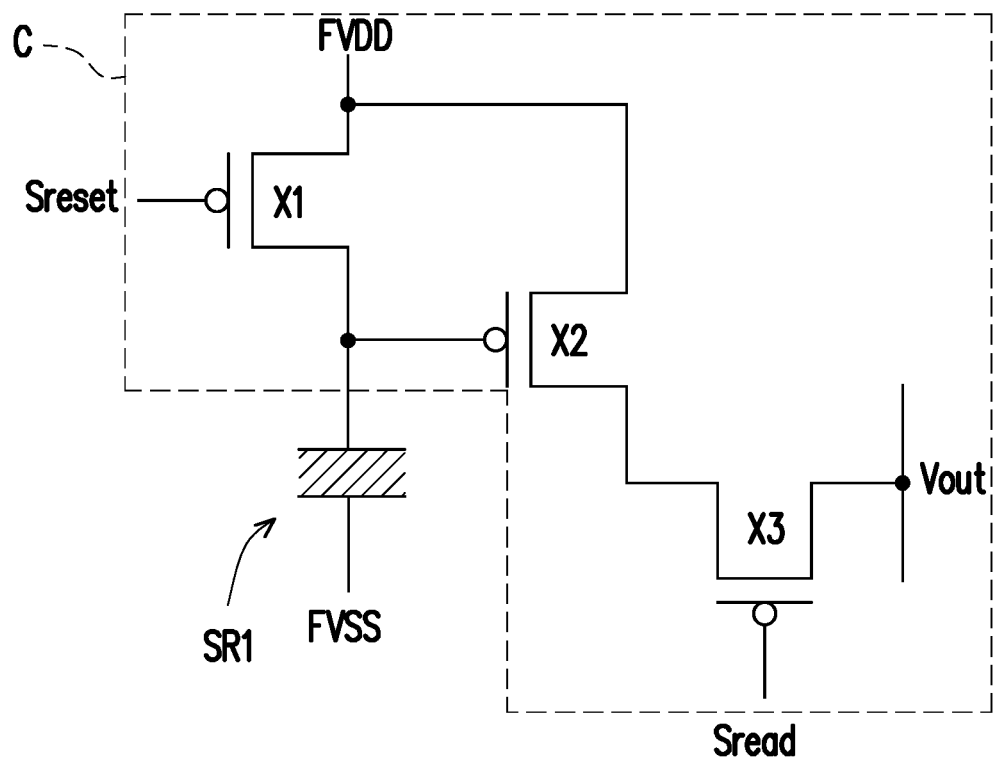
FIG. 6B is a schematic view of a detection circuit of a photosensitive element according to an embodiment of the disclosure.

FIG. 6A is a schematic top view of a light-emitting device according to an embodiment of the disclosure. FIG. 6B is a schematic view of a detection circuit of a photosensitive element according to an embodiment of the disclosure.

It is be noted that the embodiment of FIGS. 6A and 6B use the element symbols and a part of the content of the embodiment of FIG. 5, and the same or similar symbols are used to represent the same or similar elements, and the description of the same technical content is omitted. The aforementioned embodiment can be referred to for the description of the omitting parts, and details thereof will not be repeated herein.

Referring to FIGS. 6A and 6B, in this embodiment, the first light-emitting diode L1, the second light-emitting diode L2, and the third light-emitting diode L3 all partially overlap the first photosensitive element SR1 in the normal direction (the direction perpendicular to the paper surface of FIG. 6A) of the first substrate. In some embodiments, the first sensing electrode of the first photosensitive element SR1 is electrically connected to the detection circuit C, and the second sensing electrode of the first photosensitive element SR1 is electrically connected to the voltage FVSS. In other embodiments, the second sensing electrode of the first photosensitive element SR1 is electrically connected to the detection circuit C, and the first sensing electrode of the first photosensitive element SR1 is electrically connected to the voltage.

In this embodiment, the detection circuit C includes three switching elements X1, X2, and X3. The description of FIG. 3B may be referred to for the description of the detection circuit C, and details thereof will not be repeated herein.

In this embodiment, the first light-emitting diode L1, the second light-emitting diode L2, and the third light-emitting diode L3 share one first photosensitive element SR1 and one detection circuit C, thereby reducing space for circuit layout.

In some embodiments, when the light-emitting device is being inspected, the first light-emitting diode L1, the second light-emitting diode L2, and the third light-emitting diode L3 of different colors take turns to be powered on so that defects of the first light-emitting diode L1, the second light-emitting diode L2, and the third light-emitting diode L3 of different colors are respectively detected, but the disclosure is not limited thereto. In other embodiment, when the light-emitting device is being inspected, the first light-emitting diode L1, the second light-emitting diode L2, and the third light-emitting diode L3 are powered on at the same time so that defects of the first light-emitting diode L1, the second light-emitting diode L2, and the third light-emitting diode L3 are detected at the same time.

What is claimed is:

1. A light-emitting device, comprising:
   a first substrate;
   a first active element, located on the first substrate;
   a barrier layer, located on the first active element;
   a first photosensitive element, located on the barrier layer, wherein the first photosensitive element comprises:
   one first sensing electrode and two second sensing electrodes, wherein the one first sensing electrode is located between the two second sensing electrodes, wherein the one first sensing electrode and the two second sensing electrodes are separated from each other, and the one first sensing electrode and the two second sensing electrodes are located on the barrier layer; and
   a photosensitive material, located between the one first sensing electrode and the two second sensing electrodes, wherein the first sensing electrode and the two second sensing electrodes are sandwiched between the photosensitive material and the barrier layer;
   a flat layer, located on the first photosensitive element, wherein the first photosensitive element is located between the barrier layer and the flat layer; and
   a first light-emitting diode, located on the flat layer, comprising:
   a first electrode, electrically connected to the first active element, wherein the first photosensitive element is not completely shielded by the first electrode in a normal direction of the first substrate;
   a light-emitting layer, located on the first electrode; and
   a second electrode, located on the light-emitting layer.

2. The light-emitting device according to claim 1, wherein the first light-emitting diode further comprises:
   a transparent electrode, located on the flat layer, at least partially overlapping the first photosensitive element in the normal direction of the first substrate, wherein the first electrode is formed on the transparent electrode, and the first electrode is electrically connected to the first active element through the transparent electrode.

3. The light-emitting device according to claim 2, wherein the light-emitting layer extends from an upper surface of the first electrode along a side wall of an opening of the first electrode to an upper surface of the transparent electrode, a part of the light-emitting layer that contacts the upper surface of the transparent electrode is defined as a sensing region, and a part of the light-emitting layer that contacts the upper surface of the first electrode is defined as a light-emitting region, wherein the sensing region overlaps the first photosensitive element in the normal direction of the first substrate.

4. The light-emitting device according to claim 3, wherein the light-emitting region surrounds the sensing region.

5. The light-emitting device according to claim 3, further comprising:
   a second substrate, overlapping the first substrate in the normal direction of the first substrate, wherein the first light-emitting diode is located between the first substrate and the second substrate;
   a reflection layer, located on the second substrate, not overlapping the light-emitting region and the sensing region in the normal direction of the first substrate;
   a passivation layer, located on the reflection layer; and
   an antireflective layer, located on the passivation layer, wherein the antireflective layer does not overlap the light-emitting region and the sensing region in the normal direction of the first substrate, wherein a material of the antireflective layer includes black resin, chromium, chromium oxide, or molybdenum oxide.

6. The light-emitting device according to claim 5, wherein the reflection layer has a first via, the first via overlaps the light-emitting region and the sensing region in the normal direction of the first substrate, the antireflective layer has a second via, and the second via overlaps the light-emitting region and the sensing region in the normal direction of the first substrate.

7. The light-emitting device according to claim 5, wherein the reflection layer is adapted for touch electrodes.

8. The light-emitting device according to claim 2, wherein a thickness of the first electrode is 1 nanometer to 500 nanometers, and a thickness of the transparent electrode is 1 nanometer to 500 nanometers.

9. The light-emitting device according to claim 2, wherein a material of the first electrode comprises metal, and a material of the transparent electrode comprises indium tin oxide, indium zinc oxide, aluminum tin oxide, aluminum zinc oxide, or indium-gallium-zinc-oxide.

10. The light-emitting device according to claim 2, wherein the light-emitting layer extends from an upper surface of the first electrode along a side wall of the first electrode to an upper surface of the transparent electrode, a part of the light-emitting layer that contacts the upper surface of the transparent electrode is defined as a sensing region, and a part of the light-emitting layer that contacts the upper surface of the first electrode is defined as a light-emitting region, wherein the sensing region overlaps the first photosensitive element in the normal direction of the first substrate.

11. The light-emitting device according to claim 10, wherein the sensing region is located on a side of the light-emitting region.

12. The light-emitting device according to claim 10, further comprising:
   a second substrate, overlapping the first substrate in the normal direction of the first substrate, wherein the first light-emitting diode is located between the first substrate and the second substrate;
   a reflection layer, located on the second substrate, overlapping the sensing region in the normal direction of the first substrate;
   a passivation layer, located on the reflection layer; and
   an antireflective layer, located on the passivation layer, wherein the antireflective layer does not overlap the light-emitting region and the sensing region in the normal direction of the first substrate.

13. The light-emitting device according to claim 12, wherein the reflection layer has a first via, the first via overlaps the light-emitting region in the normal direction of the first substrate, the antireflective layer has a second via, and the second via overlaps the light-emitting region and the sensing region in the normal direction of the first substrate.

14. The light-emitting device according to claim 10, wherein a ratio of an area of the light-emitting region to an area of the sensing region is between 1 and 2000.

15. The light-emitting device according to claim 1, wherein the first photosensitive element is adapted for detecting defects of the first light-emitting diode.

16. The light-emitting device according to claim 1, wherein
the photosensitive material contacts a top surface of the one first sensing electrode facing away from the first substrate and top surfaces of the two second sensing electrodes facing away from the first substrate.

17. The light-emitting device according to claim 1, further comprising:
a detection circuit, located on the first substrate, wherein the first photosensitive element is electrically connected to the detection circuit.

18. The light-emitting device according to claim 17, further comprising:
a second photosensitive element, located on the barrier layer, wherein the second photosensitive element and the first photosensitive element are connected in parallel; and
a second light-emitting diode, located on the flat layer, wherein in the normal direction of the first substrate, the second photosensitive element overlaps the second light-emitting diode.

19. The light-emitting device according to claim 1, further comprising:
a second light-emitting diode, located on the flat layer, wherein in the normal direction of the first substrate, the first light-emitting diode and the second light-emitting diode both partially overlap the first photosensitive element.

20. The light-emitting device according to claim 1, further comprising:
a second substrate, overlapping the first substrate in the normal direction of the first substrate, wherein the first light-emitting diode is located between the first substrate and the second substrate, wherein the first light-emitting diode emits light toward the first substrate, and the first light-emitting diode emits light toward the second substrate.

* * * * *